(12) United States Patent
Ito et al.

(10) Patent No.: US 7,078,655 B1
(45) Date of Patent: Jul. 18, 2006

(54) CERAMIC SUBSTRATE, CERAMIC HEATER, ELECTROSTATIC CHUCK AND WAFER PROBER FOR USE IN SEMICONDUCTOR PRODUCING AND INSPECTING DEVICES

(75) Inventors: Yasutaka Ito, Gifu (JP); Yasuji Hiramatsu, Gifu (JP)

(73) Assignee: Ibiden Co., Ltd., Ogaki (JP)

( * ) Notice: Subject to any disclaimer, the term of this patent is extended or adjusted under 35 U.S.C. 154(b) by 0 days.

(21) Appl. No.: 10/048,490

(22) PCT Filed: Feb. 18, 2000

(86) PCT No.: PCT/JP00/00914

§ 371 (c)(1),
(2), (4) Date: Apr. 30, 2002

(87) PCT Pub. No.: WO01/13424

PCT Pub. Date: Feb. 22, 2001

(30) Foreign Application Priority Data

| Aug. 12, 1999 | (JP) | ................................ | 11/228908 |
| Dec. 29, 1999 | (JP) | ................................ | 11/377207 |

(51) Int. Cl.
*H05B 3/68* (2006.01)

(52) U.S. Cl. .............. 219/444.1; 219/460; 219/461.1; 219/465.1; 219/543; 219/546; 219/468.1; 219/548

(58) Field of Classification Search .......... 219/444.1, 219/460.1, 461.1, 465.1, 466.1, 467.1, 468.1, 219/543, 544, 546–548; 118/724–725
See application file for complete search history.

(56) References Cited

U.S. PATENT DOCUMENTS

| 4,621,064 A | * 11/1986 | Matsuura et al. ............ 501/15 |
| 5,314,850 A | 5/1994 | Miyahara |
| 6,001,760 A | 12/1999 | Katsuda et al. |
| 6,465,763 B1 | 10/2002 | Ito et al. |
| 6,475,606 B1 | 11/2002 | Niwa |
| 8,507,008 | 1/2003 | Hiramatsu et al. |
| 6,677,557 B1 | 1/2004 | Ito et al. |
| 2002/0043527 A1 | 4/2002 | Ito |
| 2003/0015521 A1 | 1/2003 | Ito |

FOREIGN PATENT DOCUMENTS

| EP | 0 743 290 | 11/1996 |
| EP | 0 771 772 | 5/1997 |
| JP | 58-218143 | * 12/1983 |
| JP | 61-14166 | 1/1986 |
| JP | 2-153521 | 6/1990 |
| JP | 4-84723 | 3/1992 |

(Continued)

OTHER PUBLICATIONS

"Explanation of Experimental Report (Exhibit 4) in the Written Objection by NGK", pp. 1–2 (with English translation).

"Explanation of Experimental Report (Exhibit 5) in the Written Objection by NGK", pp. 1–2 (with English translation).

"Explanation of Analysis and Experimental Report (Exhibit 6) in the Written Objection by NGK", pp. 1–6 (with English translation).

(Continued)

*Primary Examiner*—Shawntina T. Fuqua
(74) *Attorney, Agent, or Firm*—Oblon, Spivak, McClelland, Maier & Neustadt, P.C.

(57) ABSTRACT

A ceramic substrate for semiconductor manufacture and/or inspection which is conducive to decrease in α-rays radiated to prevent electrical errors, and to decrease an electrostatic chucking force such as heater or wafer prober, generation of particles, and circuit defects. The ceramic substrate is configured such that the level of α-rays radiated from the surface of the ceramic substrate is not higher than 0.250 $c/cm^2 \cdot hr$.

10 Claims, 5 Drawing Sheets

FOREIGN PATENT DOCUMENTS

| | | |
|---|---|---|
| JP | 4324276 | 11/1992 |
| JP | 5-330924 | 12/1993 |
| JP | 6-080473 | 3/1994 |
| JP | 6-135714 | 5/1994 |
| JP | 6-151332 | 5/1994 |
| JP | 61-151332 * | 5/1994 |
| JP | 6-157132 | 6/1994 |
| JP | 6177231 | 6/1994 |
| JP | 6-219844 | 8/1994 |
| JP | 6-219848 | 8/1994 |
| JP | 7-187620 | 7/1995 |
| JP | 8-130237 | 5/1996 |
| JP | 9-8011 | 1/1997 |
| JP | 9306642 | 11/1997 |
| JP | 9-315867 | 12/1997 |
| JP | 10-072260 | 3/1998 |
| WO | WO 95/21139 | 8/1995 |

OTHER PUBLICATIONS

"Explanation of Analysis and Experimental Report (Exhibit 7) in the Written Objection by NGK", pp. 1–6 (with English translation).

"Explanation of Ceramic Data Book (Cited as Exhibit 8) in the Written Objection by NGK", pp. 5, 68 and 320 (with English translation).

H. Taniguchi, New Ceramics, vol. 11, No. 9, pp. 13–18, "Recent Progress on AlN Powder and its Applications", Sep. 1998.

Y. Kubota, Electrostatic Chuck and its Application, pp. 51–57, "Special Issue: Processing Technology in Next Generation for Large Diameter Wafer", Jul. 1996.

K. Wakimuta, New Materials—Technology and Applications, vol. 3, No. 4, pp. 51–54, "Aluminum Nitride Powder Synthesized by Vapor Phase Using Organoaluminum Compound as Raw Material", Apr. 1992.

H. Taniguchi, Electronic Ceramics, vol. 22, No. 104, pp. 51–54 and 64, "Raw Material Powder for High–Thermal Conductive AlN Ceramics", 1991.

H. Taniguchi, et al., Ceramics, vol. 26, No. 8, pp. 733–737, "Recent Progress in Aluminum Nitride Powder", Aug. 1991.

H. Taniguchi, Ceramics, vol. 29, No. 8, pp. 679–681, "Aluminum Nitride Powder", Aug. 1994.

JFCA Fine Ceramics Catalogues, pp. 14 and 48, "Ultra High Purity Aluminum Nitride Powder", 1996.

H. Taniguchi, Journal of the Society of Powder Technology, vol. 34, No. 8, pp. 573, 610–616 and 642, "Aluminum Nitride Powder", 1997.

H. Taniguchi, Fine Ceramics Report, vol. 15, No. 10, pp. 226–230, "Synthesis and Application of Aluminum Nitride Powder", Oct. 1997.

T. G. Fawcett, et al., The American Ceramic Society Bulletin, vol. 75, No. 10, pp. 78–80, "Raw Materials Influence the Alpha–Particle Emission Rate of AlN", Oct. 1996.

Complaint for corresponding Japanese Patent Application, (including full text English translation) which is JP Application H11–377207.

Decision on Opposition for corresponding Japanese Patent Application, (including full text English translation) which is JP Application H11–377207.

A Written Notice of Withdrawal for the corresponding Japanese Patent Application, (including full text English translation) which is JP Application H11–377207.

N. D. Kerness, et al., "Impurity Study of Alumina and Aluminum Nitride Ceramics: Microelectronics Packaging Applications", Applied Radiation and Isotopes, vol. 48, No. 1, XP–004117527, 1997, pages 5–9.

* cited by examiner

Fig. 3
(a)
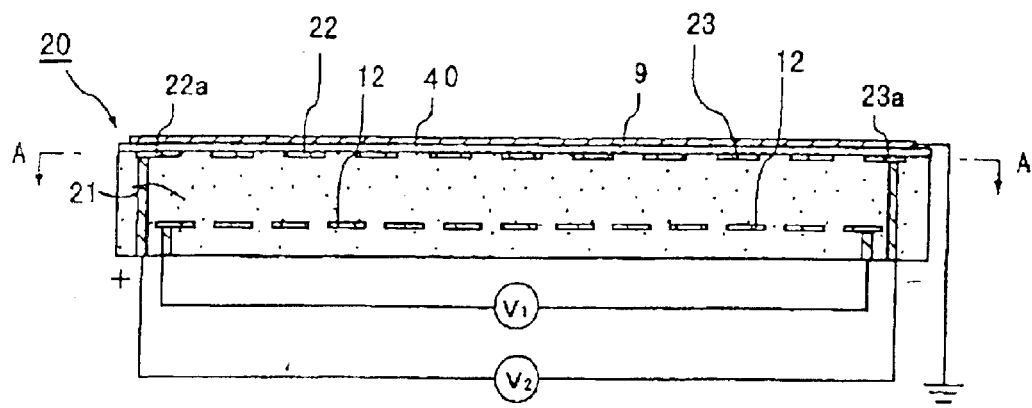
(b)
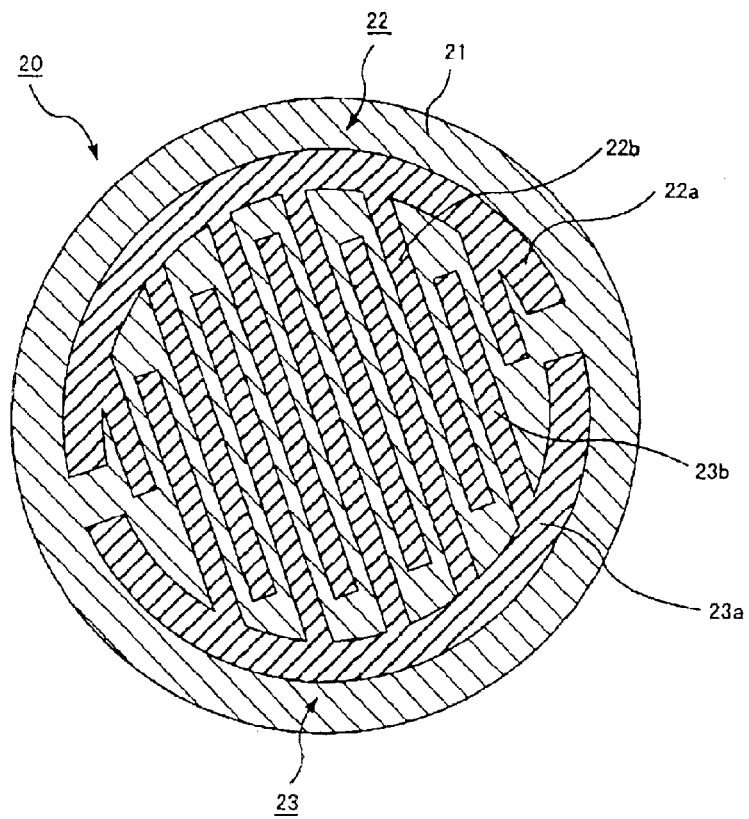

CERAMIC SUBSTRATE, CERAMIC HEATER, ELECTROSTATIC CHUCK AND WAFER PROBER FOR USE IN SEMICONDUCTOR PRODUCING AND INSPECTING DEVICES

TECHNICAL FIELD

The present invention relates essentially to the ceramic substrate, ceramic heater, electrostatic chuck and wafer prober for semiconductor manufacture and/or inspection and more particularly to a ceramic substrate for semiconductor manufacture and/or inspection which is conducive to the prevention of electrical errors, decrease in electrostatic chucking force, generation of particles, and circuit defects.

BACKGROUND ART

Semiconductor devices are manufactured through a process which comprises coating a photosensitive resin as an etching resist on a semiconductor wafer and etching the uncoated area.

While the photosensitive resin is applied in the form of a liquid to the surface of a semiconductor wafer by means of a spin coater or the like, it must be dried after coating to dissipate the solvent etc. and the thus-coated semiconductor wafer is set on a heater and heated. It is also necessary to heat the silicon wafer by, for example, sputtering.

The conventional metallic heater heretofore used for this purpose comprises a resistance heating element disposed on the reverse side of an aluminum plate.

However, such a metallic heater has the following. disadvantages.

First, because it comprises a metallic material, the heater plate must be as thick as about 15 mm. This is because a thin metal plate undergoes thermal expansion on the heating mode to develop a curl and strains to damage or tip the, semiconductor wafer placed on the metal plate. However, increasing the thickness of the heater plate leads to increases in heater weight and bulk.

Moreover, while the heater temperature is controlled by varying the voltage and current applied to the resistance heating element, the great thickness of the metal plate causes the problem that the temperature of the heater plate cannot timely follow changes in voltage and current values, thus making temperature control difficult.

Therefore, Japanese Kokai Publication Hei-9-306642 and Japanese Kokai Publication Hei-4-324276, for instance, proposed ceramic heaters each comprising a substrate board comprising AlN, which is a non-oxide ceramic material of high thermal conductivity and high strength, and a resistance heating element formed internally of said substrate board.

Furthermore, JP 2798570 discloses an electrostatic chuck comprising an AlN substrate, a resistance heating element formed therein, and, for the purpose of attracting and setting in position a semiconductor wafer on a heater, static electrodes as embedded in said AlN substrate.

SUMMARY OF THE INVENTION

However, when such a heater or an electrostatic chuck having a resistance heating element formed in an AlN substrate is employed, as compared with a heater based on an aluminum plate, there are encountered undesirable phenomenons such as erratic control actions, decrease in electrostatic chucking force, and erratic actions of testing instruments.

Also encountered are defects in the semiconductor wafer circuitry and disconnection troubles. Moreover, the trouble of deposition of particles apparently dislodged from ceramics on the surface of the semiconductor wafer has also been noted.

The inventors scrutinized these problems inherent in the prior art and found surprisingly that the cause of the troubles lies in the α-rays radiated from the AlN substrate and that by controlling the level of those α-rays below a given value, the erratic action and the decrease in electrostatic chucking force can be prevented, the deposition of ceramic particles on the semiconductor wafer surface be minimized and the incidence of circuit defects in the semiconductor wafer reduced to substantial nil. The present invention has been developed on the basis of the above findings.

The present invention, therefore, is directed to a ceramic substrate for semiconductor manufacture and/or inspection wherein the level of α-rays radiated from the surface thereof is not higher than 0.250 c/cm$^2$.hr and substantially within the range of 0.0001 to 0.250 c/cm$^2$.hr.

The present invention is further directed to a ceramic heater for the heating of semiconductor wafers or other semiconductor products, comprising a ceramic substrate and a heating element either on the surface or internally thereof, wherein the level of α-rays radiated from the heating surface of said ceramic substrate is not higher than 0.250 c/cm$^2$.hr and substantially within the range of 0.0001 to 0.250 c/cm$^2$.hr.

The present invention is further directed to an electrostatic chuck comprising a ceramic substrate and electrodes (static electrodes) embedded therein wherein the level of α-rays radiated from the surface of said ceramic substrate is not higher than 0.250 c/cm$^2$.hr and substantially within the range of 0.0001 to 0.250 c/cm$^2$.hr.

The present invention is further directed to a wafer prober comprising a ceramic substrate and a conductor layer on the surface thereof wherein the level of α-rays radiated from said surface, the surface on which said conductor layer is formed, is not higher than 0.250 c/cm$^2$.hr and substantially within the range of 0.0001 to 0.250 c/cm$^2$.hr.

BRIEF DESCRIPTION OF THE DRAWINGS

FIG. 3(*a*) is a schematic longitudinal section view of the electrostatic chuck according to the invention and (b) is a sectional view taken along the line A—A of (a).

Figure 1:
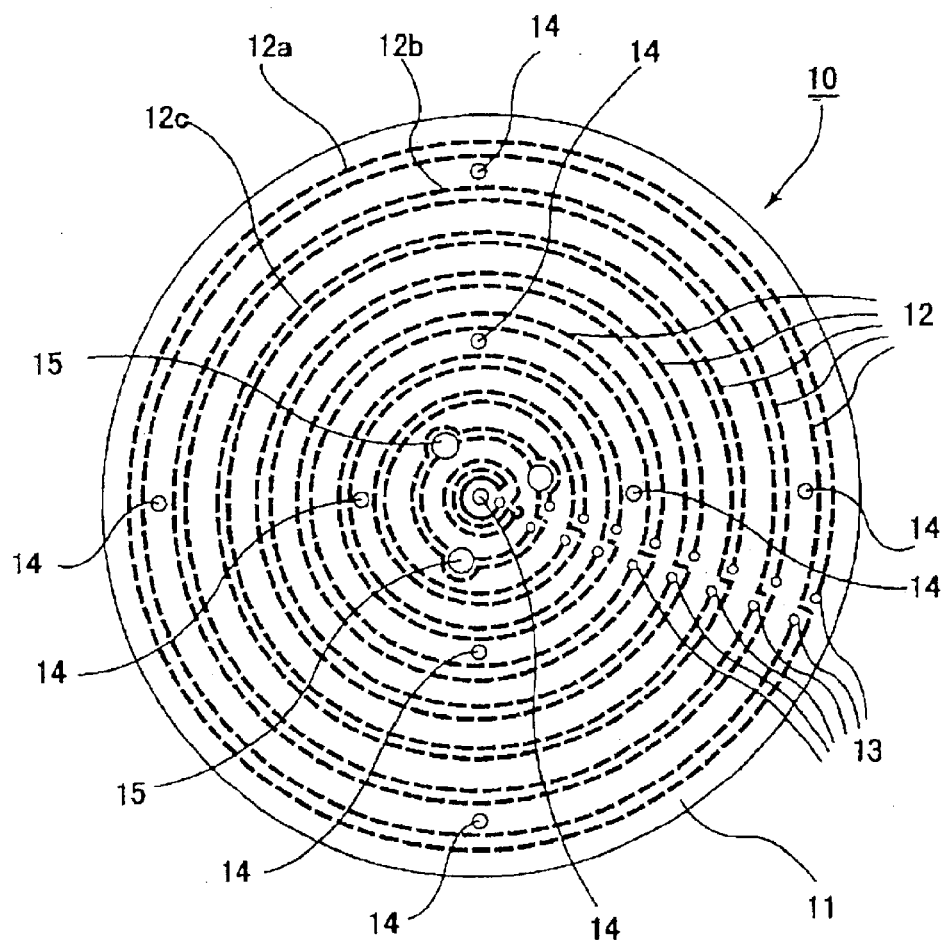
FIG. 1 is a schematic bottom view of a ceramic heater as an embodiment of the invention.

EXPLANATION OF NUMERIC SYMBOLS 2. chuck top conductive layer
3. ceramic substrate
5. guard electrode
6. ground electrode
7. grooves
8. air suction holes 10. ceramic heater
11. heater board
12. resistance heating element
13. external terminals
14. bottomed holes
15. through holes
16. support pins
17. blind holes
18. conductor-filled through holes
19. semiconductor wafer
20. electrostatic chuck
21. ceramic substrate
22. chuck positive electrode static layer
23. chuck negative electrode static layer
22a, 23a. semi-circular segment
22b, 23b. comb-shaped segment
36, 37. conductor-filled through holes
38. blind holes
39, 390, 391. External terminal pin
40. ceramic dielectric film
410. nickel layer
101. wafer prober

DISCLOSURE OF INVENTION

The inventors of the present invention energetically explored into the problems with the prior art and, as mentioned above, found surprisingly that the α-rays radiated from the ceramic substrate are causative of those problems.

Thus, the α-rays generated from the ceramic substrate create many electron-hole pairs in the semiconductor wafer. As a result, the semiconductor wafer itself is statically charged and this statistic electricity attracts particles from the ceramic substrate or triggers erratic actions of the ceramic heater and wafer prober due to the thermocouples embedded in the ceramic substrate. Furthermore, probably because of this many occurrence of electron-hole pairs in the semiconductor wafer, the electrostatic chuck electricity generated by the chuck electrodes is cancelled, thus detracting from the chucking force.

Thus, the above-mentioned problems with the prior art, regardless of whether the ceramic substrate is applied to a heater, an electrostatic chuck or a wafer prober, are likely to be derived from the electron-hole pairs which α-rays create in the semiconductor wafer.

Therefore, the problems can be overcome by controlling the emission level of α-rays from the surface (carrying a conductor layer) of the ceramic-substrate, regardless of whether the problems are associated with a ceramic heater, an electrostatic chuck or a wafer prober.

When the ceramic substrate is applied to a ceramic heater, thermocouples are disposed in the ceramic substrate but if the emission level of α-rays exceeds 0.250 c/cm$^2$.hr, the α-rays will impinge on the semiconductor wafer to form electron-hole pairs, which are causative of the static electricity, and the resulting static electricity creates electric noises in the thermocouples to cause an erratic temperature detection leading to an erratic operation of the heater. Such an erratic operation causes a delay in the time required for the temperature of the wafer-mounting surface to reach a steady level.

In the case of an electrostatic chuck, the α-rays emitted in excess of 0.250 c/cm$^2$.hr impinge on the semiconductor wafer to create electron-hole pairs and the resulting static charge cancel the charge formed on the wafer by the static electrodes to decrease the force of attraction in accordance with Coulomb's force and Johnson-Rahbeck effect.

In the case of a wafer prober, when a semiconductor wafer is set on the conductor layer (chuck top conductor layer) and the tester pins are applied against the wafer for conduction testing, the α-rays radiated in a dose in excess of 0.250 c/cm$^2$.hr causes electron-hole pairs in the semiconductor wafer and the resulting noise causes errors in the conduction test result.

Moreover, if the level of α-rays exceeds 0.250 c/cm$^2$.hr, the α-rays impinging on the semiconductor wafer produce electron-hole pairs in the semiconductor wafer, which results in the occurrence of static electricity, and the resultant static electricity attracts the particles dislodged from the ceramic substrate to the semiconductor wafer. This attraction of particles causes circuit defects in the masked-exposure process.

The ceramic substrate for semiconductor manufacture and inspection according to the present invention is characterized in that the level of α-rays radiated from the semiconductor wafer surface (semiconductor wafer mounting surface, wafer heating surface or conductor layer surface) is not higher than 0.250 c/cm$^2$.hr and substantially within the range of 0.0001 to 0.250 c/cm$^2$.hr.

By controlling the emission level of α-rays within said range, the electrically erratic action of the ceramic heater or wafer prober, decrease in electrostatic chucking force, and deposition of particles on the semiconductor wafer can be precluded, thus avoiding the risk for circuit defects.

Moreover, by limiting the emission of α-rays to 0.050 c/cm$^2$.hr or less, the number of deposited particles can be reduced to 10/cm$^2$ or less.

While, in the present invention, the electrically erratic action, decrease in electrostatic chucking force, and deposition of particles are successfully inhibited by reducing the emission level of α-rays, this causal relationship of the level off α-rays to said problems, namely electrical error, decreased chucking force, deposition of particles and incidence of circuit defects, was discovered for the first time by the inventors of the present invention and it should be understood that the inventive step of the present invention is by no means undermined by the reason that the means adopted for solving the problems, as such is simple.

Reference to the α-ray emission level of the aluminum nitride is found in "Recent Advance and Application of AlN Ceramics", New Ceramics, Vol. 11, No. 9, 1998, but no description and, for that matter even a suggestion, is found about its use in the heater for semiconductor manufacture and the equipment for inspection. Therefore, said reference does not deprecate the novelty or inventive step of the present invention.

In the present invention, the thickness of the ceramic substrate is preferably 0.5 to 50 mm. If the thickness is less than 0.5 mm, the reduced strength will increase the risk for breakage. On the other hand, if the thickness exceeds 50 mm, the poor transfer of heat will sacrifice the heating efficiency. The optimum thickness range is 20 mm or less. This is because the internal level of α-rays can be reduced.

Moreover, the ceramic substrate is preferably in the form of a disk with a diameter of not less than 200 mm. Ceramic substrates having such large areas are more probable to cause troubles related with α-rays so that the effect of the invention is more pronounced.

The ceramic substrate is preferably free of pores but, if it is porous, the porosity rate is preferably not greater than 5% and the maximum pore diameter is preferably not more than 50 μm. If these limits are exceeded, the α-rays passing through the air entrapped in the pores produce a plasma to reduce the insulation resistance at high temperature (not less than 200° C.)

The present invention is now described in detail with reference to each embodiment or application.

The ceramic heater according to the present invention comprises a heating element formed on the surface or internally of a ceramic substrate wherein the level of α-rays radiated from the surface of said ceramic substrate is not higher than 0.250 c/cm$^2$.hr and substantially within the range of 0.0001 to 0.250 c/cm$^2$.hr.

The ceramic heater of the present invention, wherein the level of α-rays radiated from the surface of the ceramic substrate is not higher than 0.025 c/cm$^2$.hr, is free from the disadvantage that the creation of electron-hole pairs in the semiconductor wafer caused by the α-rays would affect temperature data through the consequent charging of the resultant static electrocity and/or direct introduction of thermoelectrical noise to the thermocouples. Furthermore, if the level of α-rays is confined to not more than 0.025 c/cm$^2$.hr, static electrocity on the semiconductor wafer is not likely to occur, therefore the deposition of ceramic particles thereon can be reduced.

In the present invention, ideally the level of α-rays emission is equal to nil but it is technically and economically difficult to achieve an emission level less than 0.0001 c/cm$^2$.hr. On the other hand, if the emission level of α-rays exceeds 0.025 c/cm$^2$.hr, ceramic particles tend to be deposited on the semiconductor wafer, due to the static charge generated by α-rays so that the semiconductor wafer may sustain a damage crippling its function.

The cause of α-rays is the radioactive U and Th in the starting material alumina or silica for the nitride. Therefore, U and Th are removed from the starting material alumina and silica and the objective nitride ceramics are synthesized by, for example, the reductive nitriding method.

The method of removing U and Th may be a process which, as described in "Synopsis of Lectures at Association of Powder Metallurgy, p. 114, Spring 1980", comprises impregnating a porous γ-FeO$_3$ powder having a mean particle diameter of 2 to 3 μm with an alcoholic solution of titanium isopropoxide, hydrolyzing the alkoxide to cause the resulting titanium hydroxide etc. to be adsorbed on the γ-FeO$_3$ for use as a U adsorbent to be dispersed in a starting material solution.

For example, the subsequent process comprises dispersing the U adsorbent in an aqueous solution of sodium aluminate derived from bauxite (Al$_2$O$_3$) to let U be adsorbed under basic conditions, separating the adsorbent, converting the sodium aluminate to aluminum hydroxide and to be precipitated, then drying and firing it to give alumina.

While only U is discussed in the literature, the inventors found a similar effect for Th. Moreover, there are products with low α-emission levels among commercial products and such products may be purchased and used.

The alumina etc. thus obtained are nitrided by the reductive nitriding method. The reductive nitriding method comprises reducing SiO$_2$ and Al$_2$O$_3$ with carbon, such as carbon black, and simultaneously reacting them with nitrogen gas.

Though Japanese Kokai Publication Hei-9-48668 discloses a sintered aluminum nitride for semiconductor production apparatuses as synthesized by a direct nitriding method or an indirect nitriding method, the literature does not refer to the starting material alumina. Moreover, because U and Th are derived from bauxite, the amounts of U and Th cannot be reduced by the mere direct nitriding method.

The ceramic heater of the present invention is a ceramic heater for heating semiconductor wafers and comprises a heating element on the surface or internally of a nitride ceramic substrate.

Figure 2:
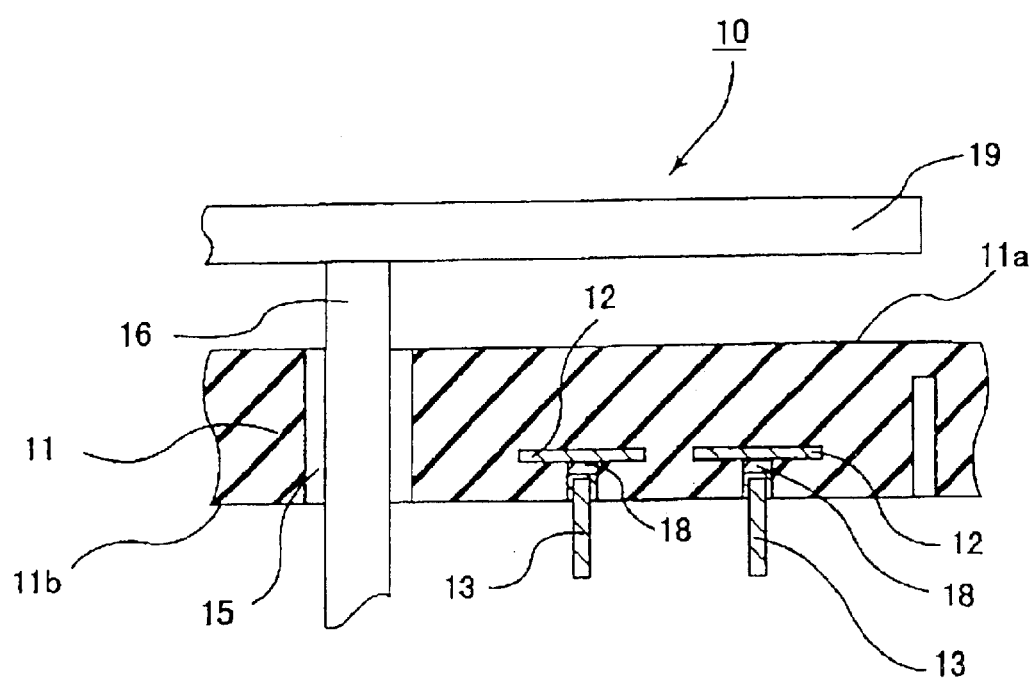
FIG. 2 a schematic cross-section view showing a portion of the ceramic heater illustrated in FIG. 1.

FIG. 1 is a schematic bottom view showing a ceramic heater of the invention and FIG. 2 is a partial section view of the same on exaggerated scale.

The ceramic substrate (hereinafter referred to as heater plate) 11 comprising nitride ceramics is prepared in the form of a disk and a resistance heating element 12 is formed internally of said heater plate 11 in a concentric circular pattern so that the wafer-heating surface (top side) of the heater plate 11 may be uniformly heated all over. Moreover, the resistance heating element 12 comprises a plurality of circular patterns with each two adjacent circles being coupled to form a single wire which is to be connected to external terminals 13, one of which serves as an input terminal with the other serving as an output terminal. In addition, adjacent to its center, the heater plate 11 is further formed with through holes 15 for accepting support pins 16 for supporting a semiconductor wafer 19 and further with bottomed holes 14 in which temperature probes are to be embedded.

It should be understood that although the resistance heating element 12 is disposed internally of the heater plate 11 in the ceramic heater 10 illustrated in FIGS. 1 and 2, the resistance heating element 12 may be formed on the bottom surface of the heater plate 11.

The constituent members forming the ceramic heater of the invention are now described in detail.

While the ceramic heater 10 of the present invention is based on nitride ceramics. Thus, because nitride ceramics are lower than metals in the coefficient of thermal expansion, they will not easily curl or warp so that a lighter and thinner heater plate 11 can be provided.

Moreover, the heater plate 11 is high in heat conductivity and thin by itself so that the surface temperature of the heater plate 11 quickly follows the change in temperature of the resistance heating element. Thus, by adjusting the voltage and current values to be applied to the resistance heating element, the surface temperature of the heater plate 11 can be easily and accurately controlled.

The ceramics mentioned above include nitride ceramics, oxide ceramics and carbide ceramics but nitride ceramics are particularly suitable.

Since nitride ceramics are high in thermal conductivity and superior in the temperature rise-and-fall characteristic, they are used for the ceramic substrate on which a wafer is directly set or supported in close proximity with its surface.

Since wafer circuit defects tend to occur when the wafer is set on a ceramic substrate, the beneficial effect of the present invention is particularly remarkable when a nitride ceramic substrate is employed.

The nitride ceramic material mentioned above includes aluminum nitride, silicon nitride, boron nitride, titanium nitride and other nitride ceramics. These ceramics can be used independently or in combination.

Among the above species, aluminum nitride is the most preferred because it has the highest heat conductivity of all, namely 180 W/m.K.

Oxide ceramics includes silica and alumina among others, and carbide ceramics include silicon carbide, for instance.

The resistance heating element 12 formed on the surface or internally of said nitride ceramic substrate is preferably divided into at least two circuits. By dividing the circuitry, the amount of heat to be generated can be adjusted by controlling the inputs to the respective component circuits, with the result that the temperature of the wafer-heating surface can be accordingly controlled.

The pattern of the resistance heating element 12 may for example be a group of concentric circles, a vortex, a group of eccentric circles, or a serpentine form but the concentric pattern illustrated in FIG. 1 is preferred because a uniform temperature distribution can be obtained over the whole surface of the heater plate.

When the resistance heating element 12 is to be formed on the surface of the heater plate 11, it is preferable to use the method which comprises coating the surface of the heater plate 11 with a conductor containing paste containing a metal particle in a predetermined circuit pattern and sintering the resulting conductor containing paste layer to bake the metal particle on the surface of the heater plate 11. It is sufficient that this sintering be effected to the extent of the metal particles being fused to each other and with the ceramics.

When the resistance heating element is formed on the surface of the heater plate 11, the thickness of the heating element is preferably 1 to 30 µm, more preferably 1 to 10 µm. On the other hand, when the resistance heating element is formed internally of the heater plate 11, its thickness is preferably 1 to 50 µm.

Moreover, when the resistance heating element is formed on the surface of the heater plate 11, the pattern width of the resistance heating element is preferably 0.1 to 20 mm, more preferably 0.1 to 5 mm. When the resistance heating element is formed internally of the heater plate 11, the pattern width of the resistance heating element is 5 to 20 µm.

The resistance value of the resistance heating element 12 can be freely adjusted by varying the pattern thickness and width but the above-mentioned ranges are most useful for practical purposes. The thinner and finer the resistance heating element pattern is, the greater is its resistance value. The resistance heating element 12 should be greater in thickness and width when it is formed internally of the resistance heater plate 11. When the resistance heating element 12 is formed internally, the distance between the heating surface and the resistance heating element 12 is comparatively short, with the result that the temperature uniformity of the heating surface tends to be poor, thus making it necessary to increase the pattern width of the resistance heating element. Moreover, when the resistance heating element 12 is to be disposed internally, its adhesion to nitride ceramics need not be taken into consideration, so that a high-melting metal such as tungsten or molybdenum or the carbide thereof can be used to increase the resistance. The thickness itself can be increased for the purpose of preventing a disconnection trouble, for instance. From these considerations, the pattern thickness and width of the resistance heating element 12 are preferably controlled within the above-mentioned ranges.

The resistance heating element 12 may be rectangular or elliptic in sectional view but preferably has a flat surface. The flat surface is more efficient in the radiation of heat toward the wafer-heating surface and is less liable to cause a temperature gradient.

The aspect ratio of the cross-section (width of resistance heating element/thickness of resistance heating element) is preferably 10 to 5000.

By controlling said aspect ratio within this range, the resistance value of the resistance heating element 12 can be increased and a temperature uniformity on the heating surface can be insured.

Assuming that the thickness of the resistance heating element 12 is constant, the use of an aspect ratio smaller than the above range leads to a relatively poor propagation of heat from the heater plate 11 in the wafer-heating direction so that a distribution of heat simulating the pattern of the resistance heating element 12 is produced on the heating surface. Conversely, if the aspect ratio is too large, a relatively high temperature will prevail in the area immediately above the center of the resistance heating element 12 so that a thermal distribution more or less simulating the pattern of the resistance heating element 12 is likewise produced on the heating surface. Therefore, in consideration of temperature distribution, the aspect ratio of the cross-section is preferably confined to the range of 10 to 5000.

When the resistance heating element 12 is to be formed on the surface of the heater plate 11, the aspect ratio is preferably 10 to 200 and when the resistance heating element 12 is to be formed internally of the heater plate 11, the preferred aspect ratio is 200 to 5000.

That a larger aspect ratio is preferred when the resistance heating element 12 is formed internally of the heater plate 11 is because, as the resistance heating element 12 is internally disposed, the distance between the heating surface and the resistance heating element 12 is relatively decreased so that the uniformity of surface temperature distribution is also reduced, thus requiring a more flat geometry for the resistance heating element 12.

When the resistance heating element 12 is to be formed in a biased position in thickness direction within the heater plate 11, it is preferably formed in a position close to the surface (bottom surface) opposite to the heating surface of the heater plate 11 and within the range of 50% through 99% of the distance from the heating surface to said bottom surface.

If the amount of offset is less than 50%, the resistance heating element 12 will be too close to the heating surface so that a temperature gradient tends to be formed on the heating surface. Conversely, if the amount of offset is over 99%, the heater plate 11 itself tends to curl to destroy the semiconductor wafer.

Furthermore, when the resistance heating element 12 is formed internally of the heater plate 11, the resistance heating element may comprise a plurality of layers. In this case, the patterns of the respective layers are preferably disposed in mutually complementary relation so that, when viewed from above the wafer-heating surface, the whole resistance heating element 12 can be observed without an overlap over the entire field of view. Typical of such layout is a staggered arrangement of the patterns.

It is also allowable to form the resistance heating element 12 internally of the heater plate 11, with a part of the resistance heating element 12 being exposed.

The conductor containing paste is not particularly restricted but is preferably a composition containing not only the metal particle or conductive ceramic particle required for electrical conductivity but also a resin, a solvent, a thickener and other additives.

The metal particle mentioned above is preferably a powder of, for example, a noble metal (gold, silver, platinum, palladium), lead, tungsten, molybdenum or nickel. These metals can be used singly or in a combination of two or more species. Those metals are comparatively resistant to oxidation and have sufficiently high resistance to generate heat.

The conductive ceramic particle includes tungsten carbide and molybdenum carbide powders. Those powders can be used each independently or in a combination of two or more species.

The preferred particle diameter of said metal or conductive ceramic particle is 0.1 to 100 µm. If the powder is finer than 0.1 µm, it will be ready to be oxidized. On the other hand, if the limit of 100 µm is exceeded, the powder will not be easily sintered and the resistance value will be increased.

The metal particle mentioned above may be spherical or flaky. A mixture of spherical and flaky powders may also be employed.

When the metal particle is flaky or a mixture of spherical and flaky particles, the metal oxide added is held more effectively between the metal particles, with the consequent advantage that a firmer adhesion can be assured between the resistance heating element 12 and the nitride ceramics and that the resistance value can be increased.

The resin for use in the conductor containing paste includes for example, epoxy resin and phenolic resin. The solvent may for example be isopropyl alcohol. The thickener may for example be cellulose.

As mentioned above, the conductor containing paste is preferably a paste prepared by adding metal oxides to the starting metal particle so that the resistance heating element 12 will be a sintered body composed of the metal and metal oxide powders. Thus, by sintering the metal oxides together with the metal particle, an intimate bond can be realized between the heater plate nitride ceramics and the metal particle.

It remains to be fully clarified as yet why incorporation of metal oxides results in an improved strength of bonding to the nitride ceramics but it may be suggested that since the surface of the metal particles and that of the nitride ceramics have been slightly oxidized and the resulting oxide films are integrally sintered together with the intermediary of the metal oxides added, thus causing an intimate adhesion of the metal particle to the nitride ceramics.

The metal oxides mentioned above are preferably at least one kind of the members selected from the group consisting of lead oxide, zinc oxide, silica, boron oxide ($B_2O_3$), alumina, yttria and titania.

These oxides are capable of improving the adhesion between the metal particle and nitride ceramics without increasing the resistance value of the resistance heating element 12.

The proportions of said lead oxide, zinc oxide, silica, boron oxide ($B_2O_3$), alumina, yttria and titania in each 100 weight parts of the total metal oxide are 1 to 10 (weight parts; the same applies below) for lead oxide, 1 to 30 for silica, 5 to 50 for boron oxide, 20 to 70 for zinc oxide, 1 to 10 for alumina, 1 to 50 for yttria, and 1 to 50 for titania. The total of these oxides is preferably not more than 100 weight parts.

By adjusting the amount of the oxide (s) within the above range, the bonding of the metal particle to nitride ceramics, in particular, can be improved.

The addition amount of said metal oxide(s) relative to the metal particle is preferably not less than 0.1 weight % and less than 10 weight %. Moreover, the area resistivity of the resistance heating element 12 formed by using a conductor containing paste of the above composition is preferably 1 to 45 mΩ/□. If the area resistivity exceeds 45 mΩ/□, the generation of heat will be too great in relation to the level of voltage applied so that the generation of heat can hardly be controlled in the case of a heater plate 11 carrying the resistance heating element 12 on its surface. If the addition amount of said metal oxide(s) is not less than 10 weight %, the area resistivity will exceed 50 mΩ/□ and the excessively increased heat generation will make temperature control difficult and the uniformity of temperature distribution will be sacrificed.

When the resistance heating element 12 is formed on the surface of the heater plate 11, a metal cover layer is preferably formed on the surface of the resistance heating element 12. Because the layer prevents oxidation of the sintered metal and consequent change in resistance value. The thickness of the metal cover layer thus formed is preferably 0.1 to 10 µm.

The metal for use in the formation of said metal cover layer is not particularly restricted only provided that it is a non-oxidizable metal. Thus, it may for example be gold, silver, palladium, platinum or nickel. These metals can be used alone or in a combination of two or more species. Among the metals mentioned above, nickel is particularly preferred.

The resistance heating element 12 must, of course, be provided with terminals for electrical connection to a power source and since these terminals are generally attached to the resistance heating element 12 via a solder, a nickel layer is preferred because it prevents thermal diffusion of the solder. As connecting terminals, external terminals 13 made of Koval®, for instance, can be used.

When the resistance heating element 12 is formed internally of the heater plate 11, the surface of the resistance heating element 12 will not be oxidized and, therefore, need not be covered. When the resistance heating element 12 is formed internally of the heater plate 11, the resistance heating element may be left partially exposed, or may be provided with conductor-filled through holes at its terminal positions for connecting and securing in position said external terminals.

As the solder for use in connecting the external terminals, various alloys such as silver-lead, lead-tin, bismuth-tin, etc. can be used. The preferred thickness of the solder layer is 0.1 to 50 µm. Within this range, firm solder connections can be obtained.

Furthermore, as illustrated in FIG. 2, the heater plate 11 may be provided with through holes 15 so that by inserting pins (not shown) into the through holes 15, the semiconductor wafer may be delivered to a transfer machine (not shown) or received from the transfer machine.

With the ceramic heater of the present invention, the semiconductor wafer can be heated with a clearance of 50 to 500 µm maintained from the ceramic substrate. By providing this clearance, the wafer can be protected more or less from the influence of the surface temperature distribution of the ceramic substrate. In this mode of use, the wafer is supported with support pins 16 and heated in that position.

The method of manufacturing the ceramic heater of the present invention is now described.

First, the process for fabricating a ceramic heater having a resistance heating element on the bottom surface of a heater plate 11 is described.

(1) Fabrication of a Heater Plate

The nitride ceramic powder described above, e.g. an aluminum nitride ceramic powder, is formulated with optional sintering aids, such as yttria etc., a binder, and other components to prepare a slurry. This slurry is spray-dried and the resulting granules are placed in a metal mold or the like and compressed into a plate form to provide a raw formed body(green).

When the ceramic heater is to be provided with the function of an electrostatic chuck, a metal foil or the like for electrostatic chucking can be embedded in the raw formed body.

Then, the raw formed body is optionally formed with through holes for accepting said support pins for supporting a semiconductor wafer and, further, with bottomed holes in which temperature probes such as thermocouples are to be embedded. Optionally, the above processing may be performed after the sintering operation.

Then, this raw formed body is heated and fired to be sintered and provide a ceramic substrate. A heater plate 11 is then prepared by machining this ceramic substrate. As an alternative, the ceramic substrate may be manufactured to the specified size so that it may directly be used as the heater plate 11 after firing. Then, by conducting a heating and firing operation under pressure, a porosity-free heater plate 11 can be fabricated. The heating temperature may be any suitable temperature not less than the sintering point of the ceramics but, in the case of nitride ceramics, a temperature within the range of 1000 to 2500° C. is used.

(2) Printing the Heater Plate with a Conductor Containing Paste

The conductor containing paste is generally a highly viscous fluid comprising a metal particle, a resin and a solvent. The conductor containing paste layer is formed by printing the body with said conductor containing paste in the pattern corresponding to a resistance heating element by the screen printing technique, for instance. Since the resistance heating element is required to set the heater plate at a uniform temperature over its whole surface, it is preferably printed in a concentric circular pattern as illustrated in FIG. 1.

It is preferable that the conductor containing paste layer be formed in such a manner that the resistance heating element 12 after sintering will have a rectangular section and a flat surface.

(3) Firing the Conductor Containing Paste

The conductor containing paste layer printed on the bottom surface of the heater plate 11 is heated and fired to remove the resin and solvent, to sinter the metal particle onto the bottom surface of the heater plate 11, and thereby to form a resistance heating element 12. The heating temperature is preferably 500 to 1000° C.

When said metal oxide(s) have been incorporated in the conductor containing paste, the metal particle, heater plate and metal oxide(s) are integrally sintered to provide an improved bond between the resistance heating element and heater plate.

(4). Formation of a Metal Cover Layer

The surface of the resistance heating element 12 is preferably provided with a metal cover layer. The metal cover layer can be formed by, for example, electrolytic plating, electroless plating or sputtering but, for mass production, electroless plating is the most suitable of all.

(5) Attaching Terminals etc.

To ends of each circuit pattern constituting the resistance heating element 12, terminals (external terminals 13) for electrical connection to a power source are attached by soldering. In addition, thermocouples are inserted into the bottomed holes 14 and secured in situ with a silver or gold brazing material and further sealed with a heat-resistant resin such as a polyimide resin to complete the manufacture of a ceramic heater.

The method of manufacturing a ceramic heater (FIGS. 1 and 2) having a resistance heating element 12 internally of a heater plate 11 is now described.

(1) Fabrication of a Heater Plate

First, the nitride ceramic powder is mixed with the binder, solvent, etc. to prepare a paste, and using the paste, a green sheet is formed.

The nitride ceramic powder as mentioned above includes an aluminum nitride powder, and where necessary, sintering aids such as yttria may be added.

The binder is preferably at least one member selected from the group consisting of acrylic binder, ethylcellulose, butylcellosolve and polyvinyl alcohol.

The solvent is preferably at least one member selected from the group consisting of α-terpineol and glycol.

The paste obtained by compounding those components is molded by the doctor blade method to provide said green sheet.

The preferred thickness of the green sheet is 0.1 to 5 mm.

Then, where necessary, the green sheet is formed with means serving as through holes 15 for accepting support pins for supporting a semiconductor wafer, means serving as bottomed holes in which temperature probes such as thermocouples are to be embedded, and means serving as conductor-filled through holes 18 for connecting the resistance heating element to external terminal pins. This processing may be carried out after formation of a green sheet laminate to be described below or after sintering of the laminate.

(2) Printing the Green Sheet with the Conductor Containing Paste

On the green sheet, the conductor containing paste containing a metal or conductive ceramic particle is printed.

In this step, not only the conductor containing paste layer for the resistance heating element but also the conductor containing paste layer necessary for fabrication of the electrostatic chuck can be formed.

The conductor containing paste contains a metal or conductive ceramic particle.

The mean particle diameter of tungsten or molybdenum powder is preferably 0.1 to 5 μm. If the mean particle diameter is less than 0.1 μm or over 5 μm, the printability of the conductor containing paste will be unsatisfactory.

The conductor containing paste may for example be a composition (paste) comprising 85 to 87 weight parts of a metal or conductive ceramic particle, 1.5 to 10 weight parts of at least one kind of binder selected from the group consisting of acrylic binder, ethylcellulose, butylcellosolve and polyvinyl alcohol, and 1.5 to 10 weight parts of at least one kind of solvent selected from the group consisting of α-terpineol and glycol.

(3) Laminating Green Sheets

The green sheets not printed with the conductor containing paste are laminated on both sides of the green sheet printed with the conductor containing paste.

In this step, it is arranged so that the number of green sheets to be laminated on the top side is larger than the number of green sheets to be laminated on the bottom side so that the resistance heating element will be located closer to the bottom side.

Specifically, the preferred number of green sheets to be laminated is 20 to 50 on the top side and 5 to 20 on the bottom side.

(4) Sintering the Green Sheet Laminate

The green sheet laminate is hot-pressed to sinter the green sheets and the conductor containing paste within the laminate.

The heating temperature is preferably 1000 to 2000° C. and the pressure to be applied is preferably 100 to 200 kg/cm$^2$. The heating operation is performed in an inert gas atmosphere. The inert gas may for example be argon gas or nitrogen gas.

The bottomed holes for accepting temperature probes may be formed after this sintering operation. The bottomed holes can be formed by blasting, e.g. sandblasting, after surface polishing. In addition, terminals are attached to the conductor-filled through holes for connection to the internal resistance heating element, followed by heating for reflow. The heating temperature is preferably 200 to 500°.

Then, thermocouples as temperature probes are secured in position with a silver or gold brazing material and sealed with a heat-resistant resin such as polyimide resin to complete the manufacture of a ceramic heater.

The electrostatic chuck of the present invention is now described.

The electrostatic chuck of the invention comprises a nitride ceramic substrate and static electrodes embedded within said ceramic, wherein the level of α-rays radiated from the wafer-heating surface of said ceramic substrate is not higher than 0.250 c/cm$^2$.hr and substantially within the range of 0.0001 to 0.250 c/cm$^2$.hr.

The nitride ceramic substrate for this electrostatic chuck of the present invention comprises the same material as the ceramic substrate for the ceramic heater of the present invention hereinbefore, and also manufactured in the same manner. Thus, the level of α-rays radiated from the wafer-mounting surface is substantially controlled to 0.0001 to 0.250 c/cm$^2$.hr so that the wafer surface is not scarcely charged by the impingement of α-rays. As a consequence, the static charge generated on the wafer by the static electrodes is substantially not cancelled so that the decrease in the force of attraction in accordance of the Johnson-Rahbeck effect can be prevented.

Moreover, when the α-rays level is not higher than 0.025 c/cm$^2$.hr, the static electricity on the semiconductor wafer is scarcely generated and, therefore, the amount of deposition of particles is also reduced.

In the present invention, ideally the level of α-rays emission is equal to nil but it is technically and economically difficult to achieve an emission level less than 0.0001 c/cm$^2$.hr. On the other hand, if the emission level of α-rays exceeds 0.025 c/cm$^2$.hr, ceramic particles tend to be deposited on the semiconductor wafer due to the static charge generated by α-rays so that the semiconductor wafer may sustain a damage crippling its function.

FIG. 3(*a*) is a schematic longitudinal section view of the electrostatic chuck and (b) is a sectional view of the same chuck as taken along the line A—A of (a).

This electrostatic chuck 20 comprises a ceramic substrate 21, chuck positive electrode static layer 22 and chuck negative electrode static layer 23, disposed internally of said ceramic substrate 21, and a 5 to 1500 μm-thick ceramic dielectric film 40 formed on said electrodes. Formed within said ceramic substrate 21 is a resistance heating element 12 so as to heat a silicon wafer 9. Where necessary, an RF electrode may be embedded in the ceramic substrate 21.

As shown in (b), the electrostatic chuck 20 is usually formed in a circular configuration in plan view, and disposed internally of the ceramic substrate 21 are the chuck positive electrode static layer 22 comprising a semi-circular segment 22*a* and a comb-shaped segment 22*b* and the chuck negative electrode static layer 23 similarly comprising a semi-circular segment 23*a* and a comb-shaped segment 23*b*, the two layers 22 and 23 being arranged face-to-face in such a manner that the teeth of the two comb-shaped segments 22*b*, 23*b* are in staggered relation.

For operating this electrostatic chuck, the chuck positive electrode static layer 22 and chuck negative electrode static layer 23 are connected to the + and − terminals, respectively, and a DC source and charged. Thereupon, the semiconductor wafer set on the electrostatic chuck is attracted by static electricity.

In this electrostatic chuck, the resistance heating element may be embedded internally of the ceramic substrate 21 as shown in FIG. 3 or formed on the surface (bottom side) of the ceramic substrate 21.

The method of manufacturing the above electrostatic chuck is substantially identical to the method of manufacturing the ceramic heater except that the surface of said green sheet is coated with a conductor containing paste in the configurations of the chuck positive electrode static layer 22 and chuck negative electrode static layer 23 or a metal foil is embedded according to the patterns of said chuck positive electrode static layer 22 and chuck negative electrode static layer 23.

The wafer prober of the present invention is now explained.

In this wafer prober, the level of α-rays radiated from the wafer-mounting surface is controlled to 0.0001 to 0.250 c/cm$^2$.hr, whereby the noise signal derived from α-rays is hardly produced in the chuck top conductor layer, with the result that errors in the conduction test can be precluded.

Moreover, when the emission level is controlled to not more than 0.025 c/cm$^2$.hr, the semiconductor wafer is hardly charged electrostatically so that the deposition of particles on the wafer can be decreased.

In the wafer prober of the present invention, the chuck top conductor layer is formed on the surface of the ceramic substrate.

The conduction test is performed by setting a wafer on the chuck top conductor layer and pressing a probe card carrying tester pins against the wafer.

The noble metal layer formed on the chuck top conductor layer does not interfere with the current conduction to the reverse side of the wafer and prevents diffusion of boron and phosphorus in the chuck top conductor layer and of yttria, sodium etc. in the ceramics.

The noble metal is preferably at least one member selected from among gold, silver, platinum and palladium.

Because the wafer prober of the present invention is based on a ceramic substrate of high rigidity, the chuck top is not caused to curl even if it is pressed by the tester pins of the probe card so that the chuck top layer may be made smaller in thickness than the case of the metal substrate.

Moreover, because the chuck top may be designed to be smaller in thickness than the case of the metal substrate, the heat capacity may be reduced even though the heat conductivity of ceramics is low as compared with metals as the outcome, so that the temperature rise-and-fall characteristic can be improved.

The preferred thickness of said chuck top conductor layer is 1 to 10 μm. If it is less than 1 μm, the layer will be too high in resistance to function as an electrode. On the other hand, if the limit of 10 μm is exceeded, the layer tends to peel off due to the strain in the conductor.

For the formation of the chuck top conductor layer, at least one metal selected from among high-melting metals such as copper, titanium, chromium, nickel, noble metals (gold, silver, platinum, etc.), tungsten, molybdenum, etc. can be used.

Preferably, the chuck top conductor layer contains nickel, for this metal is high in hardness and is not easily deformed by the pressure of tester pins.

The wafer prober according to the present invention is preferably equipped with a guard electrode and a ground electrode as embedded in the ceramic substrate. The guard electrode is intended to cancel stray capacitance in the measuring circuit, and the earth potential of the measuring circuit (that is the chuck top conductor layer) is applied thereto. The ground electrode is intended to cancel the noise from the temperature control means.

The chuck top conductor layer-forming surface of the wafer prober according to the present invention is preferably formed with grooves and air suction holes. In this arrangement, the wafer W can be attracted by setting the wafer and withdrawing air through the suction holes.

The apparatuses for semiconductor manufacture and inspection according to the present invention can be put to use at a temperature ranging from 150° C. to 900°.

BEST MODE FOR CARRYING OUT THE INVENTION

The present invention is now described in further detail.
(Example of Synthesis) Synthesis of aluminum nitride
(1) A porous γ-$Fe_2O_3$ powder with a mean particle diameter of 3 μm was impregnated with a 10 weight % ethanolic solution of titanium isopropoxide containing 0.5 weight % of HCl and allowed to stand for hydrolysis at 25° C. for 24 hours to provide a U/Th adsorbent.
(2) In a Teflon vessel, 1000 weight parts of pulverized bauxite was mixed with a 10% aqueous solution of sodium hydroxide, and the mixture was treated in an autoclave at 190° C. for 5 hours. The reddish sludge was filtered off to recover an aqueous solution of sodium aluminate.
(3) This aqueous solution of sodium aluminate was adjusted to pH 12 with 1N-HCl and the above adsorbent was dispersed therein at 50° C. for 0.5 hour under vibration. Similarly, dispersions kept under vibration for 1, 2, 3, 4, 5 and 6 hours were prepared. Thus, a total of 7 kinds of dispersions were provided.
(4) The adsorbent was filtered off and the filtrate was adjusted to pH 8.5 with hydrochloric acid to cause aluminum hydroxide to separate out. The precipitate was rinsed with distilled water, dried at 80° C. for 5 hours, and fired in the air at 1000° C. to provide alumina.
(5) One-thousand (1000) weight parts of the alumina prepared in step (4) was mixed with 353 weight parts of graphite and reacted in a nitrogen gas stream at 1950° C. for 5 hours. Then, the unreacted C was oxidized and removed at 350° C. to give aluminum nitride.
(6) This aluminum nitride was pulverized in a ball-mill and size-selected with a pneumatic classifier to provide a powder having a mean particle diameter of 1.1 μm.

The powders exposed to vibration for 6 hr, 5 hr, 4 hr, 3 hr, 2.5 hr, 2 hr, 1 hr and 0.5 hr were designated A, B, C, D, E, F, G and H, respectively. The U and Th contents of each powder are shown below in Table 1. The determinations were made by the ICP-MS method.

TABLE 1

|  | U content (ppb) | Th content (ppb) |
|---|---|---|
| Powder A | 4.5 | 0.9 |
| Powder B | 5.0 | 4.5 |
| Powder C | 51 | 26 |
| Powder D | 67 | 20 |
| Powder E | 150 | 20 |
| Powder F | 590 | 4 |
| Powder G | 600 | 5 |
| Powder H | 650 | 30 |

EXAMPLE 1
Manufacture of a Ceramic Heater Having a Heating Element on Its Surface
(1) A composition comprising 100 weight parts of any of said aluminum nitride powders A to G having a mean particle diameter of 1.1 μm, 4 weight parts of yttria (mean particle dia.: 0.4 μm), 12 weight parts of acrylic binder and the balance of alcohol was spray-dried to prepare a granular powder.
(2) This granular powder was set in a metal mold and formed into a raw formed body.
(3) The raw formed body was then hot-pressed at 1800° C. and 200 kg/$cm^2$ to provide a 3 mm-thick aluminum nitride board.

From this board, a disk having a diameter of 210 mm was cut out to provide a ceramic disk (heater plate). This plate was drilled to form apertures corresponding to the through holes for accepting support pins for supporting a semiconductor wafer and cavities corresponding to the bottomed holes for embedding thermocouples (diameter: 1.1 mm, depth: 2 mm).
(4) On the heater plate processed in (3) above, a conductor containing paste was applied by screen printing. The printing pattern was a concentric circular pattern as shown in FIG. 1.

The conductor containing paste used was Solbest PS603D available from Tokuriki Kagaku Kenkyusho, which is in common use for the formation of plated-through holes in printed circuit boards.

This conductor containing paste is a silver-lead paste containing, based on 100 weight parts of silver, 7.5 weight parts of metal oxide comprising lead oxide (5 wt. %), zinc oxide (55 wt. %), silica (10 wt. %), boron oxide (25 wt. %) and alumina (5 wt. %). The silver powder was a flaky powder having an average particle diameter of 4.5 μm.
(5) The heater plate printed with the conductor containing paste as above was then heated at 780° C. to sinter the silver and lead in the conductor containing paste and bake them onto the heater plate 11 to form a resistance heating element 12. The resistance heating element composed of silver and lead was 5 μm thick×2.4 mm wide and had an area resistivity of 7.7 mΩ/□.
(6) The heater plate 11 thus fabricated in (5) above was dipped in an electroless plating bath comprising an aqueous solution of nickel sulfate: 80 g/l, sodium hypophosphite: 24 g/l, sodium acetate: 12 g/l, boric acid: 8 g/l and ammonium chloride: 6 g/l to deposit a 1 μm-thick metal cover layer (nickel layer) on the surface of the silver-lead resistance heating element 12.
(7) The parts to which terminals are to be attached for electrical connection to a power source are printed with a silver-lead soldering paste (manufactured by Tanaka Noble Metals) by the screen printing technique to form a solder layer.

On the solder layer, external terminals of Koval® were placed, followed by heating for reflow at 420° C. In this manner, the external terminals were rigidly secured to the surface of the resistance heating element. position with a 81.7 Au-18.3 Ni gold brazing material (fusion by heating at 1030° C.) to provide a ceramic heater.

EXAMPLE 2
Manufacture of an Electrostatic Chuck Internally Provided with a Heating Element and Static Electrodes
(1) A paste was prepared by compounding 100 weight parts of any of said aluminum nitride powders A to G with 4 weight parts of yttria (average particle diameter: 0.4 μm), 11.5 weight parts of acrylic binder, 0.5 weight part of dispersant and 53 weight parts of alcohol (1-butanol and ethanol), and using the paste a 0.47 mm-thick green sheet was molded by the doctor blade method.
(2) This green sheet was dried at 80° C. for 5 hours and punched to form through holes 15 serving as semiconductor wafer-support pin-accepting holes, 1.8 mm, 3.0 mm and 5.0 mm in diameter, and those serving as conductor-filled through holes 18 for electrical connection to external terminals.

(3) A conductor containing paste A was prepared by compounding 100 weight parts of a tungsten carbide powder having a mean particle diameter of 1 µm, 3.0 weight parts of acrylic binder, 3.5 weight parts of the solvent α-terpineol, and 0.3 weight part of dispersant.

A conductor containing paste B was prepared by compounding 100 weight parts of a tungsten powder having a mean particle diameter of 3 µm, 1.9 weight parts of acrylic binder, 3.7 weight parts of the solvent α-terpineol, and 0.2 weight part of dispersant.

Using this conductor containing paste A, a conductor containing paste layer was formed on the green sheet by screen printing as shown in FIG. 1. The printing pattern was a concentric circular pattern. On another green sheet, a conductor containing paste layer was formed according to the static electrode pattern illustrated in FIG. 3.

In addition, the through holes serving as conductor-filled through holes for connecting external terminals were filled with the conductor containing paste B.

The green sheet which had gone through the above processing was laminated with 37 and 13 units of green sheet not printed with the tungsten paste on the top (heating surface) and bottom sides, respectively. The laminating temperature and pressure were 130° C. and 80 kg/cm².

(4) The above laminate was degreased in a nitrogen gas atmosphere at 600° C. for 5 hours and hot-pressed at 1890° C. and 150 kg/cm² for 3 hours to provide a 3 mm-thick aluminum nitride plate. From this plate, a disk 230 mm in diameter was cut out to provide a ceramic substrate internally provided with 6 µm-thick×10 mm-wide resistance heating element and static electrodes.

(5) The disk obtained in (4) was polished with a diamond wheel, and with a mask set in position, its surface layer was formed with bottomed holes (diameter: 1.2 mm, depth: 2.0 mm) for accepting thermocouples by sandblasting with SiC or the like.

(6) The conductor-filled through holes were partially bored to form recesses, in which external terminals made of Koval® were secured in position with a gold brazing material composed of Ni—Au alloy under heating for reflow at 700° C.

The mode of connection of said external terminals is preferably a 3-point tungsten support system, because said system is high in connection reliability.

(7) Then, a plurality of thermocouples for temperature control were embedded in the bottomed holes to complete the manufacture of a ceramic heater having an electrostatic chuck function. The thickness of the dielectric film was 1000 µm.

EXAMPLE 3

Manufacture of a Wafer Prober (1) A paste was prepared by compounding 100 weight parts of any of said aluminum nitride powders A to G (average particle diameter; 1.1 µm) with 4 weight parts of yttria (average particle diameter: 0.4 µm), 11.5 weight parts of acrylic binder, 0.5 weight part of dispersant and 53 weight parts of alcohol (1-butanol and ethanol), and using the paste, a 0.47 mm-thick green sheet 30 was molded by the doctor blade method.

(2) This green sheet was dried at 80° C. for 5 hours and then punched to form apertures to serve as the conductor-filled through holes for connecting the resistant heating element to external terminal pins.

(3) A conductor containing paste A was prepared by compounding 100 weight parts of a tungsten carbide powder having a mean particle diameter of 1 µm, 3.0 weight parts of acrylic binder, 3.5 weight parts of the solvent α-terpineol, and 0.3 weight part of dispersant.

A conductor containing paste B was prepared by compounding 100 weight parts of a tungsten powder having a mean particle diameter of 3 µm, 1.9 weight parts of acrylic binder, 3.7 weight parts of the solvent α-terpineol, and 0.2 weight part of dispersant.

Using said conductor containing paste A, the green sheet 30 was printed with the guard electrode pattern and the ground electrode pattern in the grid form by the screen printing technique.

Moreover, the apertures for serving as through-holes for connection to external terminal pins were filled with the conductor containing paste B.

Figure 4:
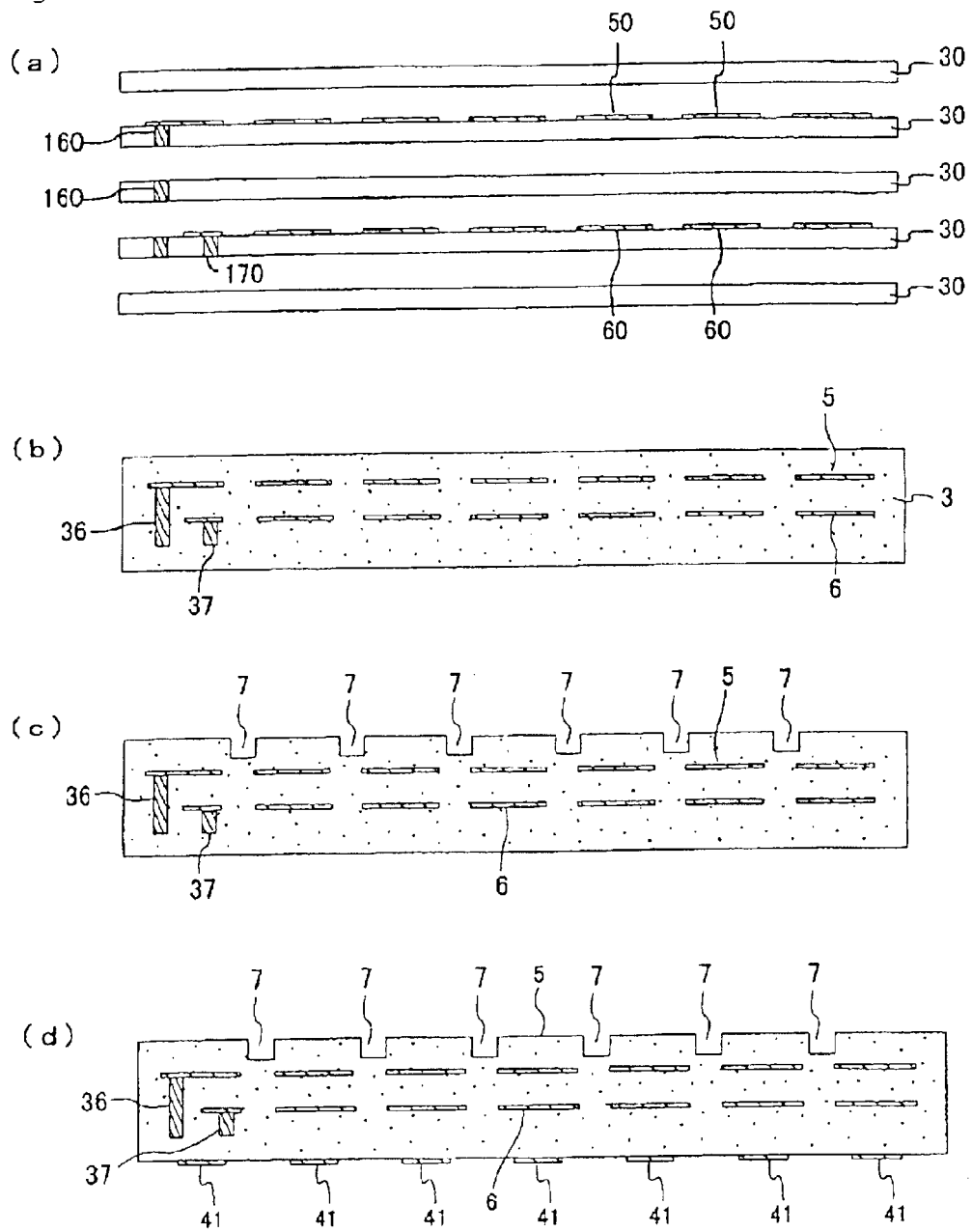
FIG. 4(*a*) to (*d*) are schematic views showing a part of the flow of production of the wafer prober according to the invention.

In addition, the printed green sheet 30 was laminated with 50 units of the unprinted green sheet at a temperature of 130° C. and a pressure of 80 kg/cm² (FIG. 4(*a*)).

(4) The resulting laminate was degreased in a nitrogen gas atmosphere at 600° C. for 5 hours and hot-pressed at 1890° C. and 150 kg/cm² for 3 hours to provide a 3 mm-thick aluminum nitride plate. From this plate, a disk with a diameter of 230 mm was cut out to give a ceramic substrate 3 (FIG. 4(*b*)). The size of conductor-filled through holes 36, 37 was 0.2 mm in diameter and 0.2 mm in depth. The thickness of guard electrode 5 and ground electrode 6 was 10 µm and the position of the guard electrode 5 was 1 mm away from the resistance heating element 41, while that of the ground electrode 6 was 1.2 mm from the grooved surface.

(5) The ceramic substrate 3 obtained in step (4) was polished with a diamond wheel and, with a mask set in position, cavities (not shown) for accepting thermocouples and grooves 7 (0.5 mm wide×0.5 mm thick) for absorption of a wafer were formed by sandblasting with SiC or the like (FIG. 4(*c*)).

(6) Then, a resistance heating element pattern is printed on the surface opposite to the surface formed with grooves 7. This printing was formed with a conductor containing paste. The conductor containing paste used was Solbest PS603D from Tokuriki Kagaku Kenkyusho, which is in common use for the formation of plated-through holes in printed circuit boards. This conductor containing paste is a silver-lead paste containing 7.5 weight %, based on the weight of silver, of the metal oxide comprising lead oxide, zinc oxide, silica, boron oxide and alumina (5/55/10/25/5, by weight).

The silver was a flaky powder with a mean particle diameter of 4.5 µm.

(7) The ceramic substrate 3 printed with the conductor containing paste was baked at 780° C. to sinter the silver and lead in the conductor containing paste and bake them onto the ceramic substrate 3 to provide a resistance heating element 41. Further, this ceramic substrate was dipped in an electroless nickel plating bath comprising an aqueous solution of nickel sulfate: 30 g/l, boric acid: 30 g/l, ammonium chloride: 30 g/l and Rochelle salt: 60 g/l to deposit a 1 µm-thick nickel layer 410 with a boron content of not more than 1 weight % on the surface of the sintered silver. The substrate was then subjected to annealing at 120° C. for 3 hours.

The pattern of resistance heating element 41 was 5 µm thick×2.4 mm-wide and the area resistivity was 7.7 mΩ/□ (FIG. 4(*d*)).

(8) On the surface formed with grooves 7, a titanium layer, a molybdenum layer and a nickel layer were serially constructed by sputtering. As the sputtering equipment, Japan Vacuum Technology's SV-4540 was used. Sputtering conditions were 0.6 Pa, 100° C. and 200 W and the sputtering time was adjusted for each metal species within the range of 30 seconds to 1 minute.

The deposition thickness estimated from the image output of a fluorescent X-ray analyzer was 0.3 μm for the titanium layer, 2 μm for the molybdenum layer and 1 μm for the nickel layer.

(9) The ceramic substrate obtained in the above step (8) was dipped in an electroless nickel plating bath comprising an aqueous solution of nickel sulfate: 30 g/l, boric acid: 30 g/l, ammonium chloride: 30 g/l, and Rochelle salt: 60 g/l to form a 7 μm-thick nickel film with a boron content of not more than 1 weight % on the surface of grooves 7, followed by 3 hours of annealing at 120° C.

Figure 5:
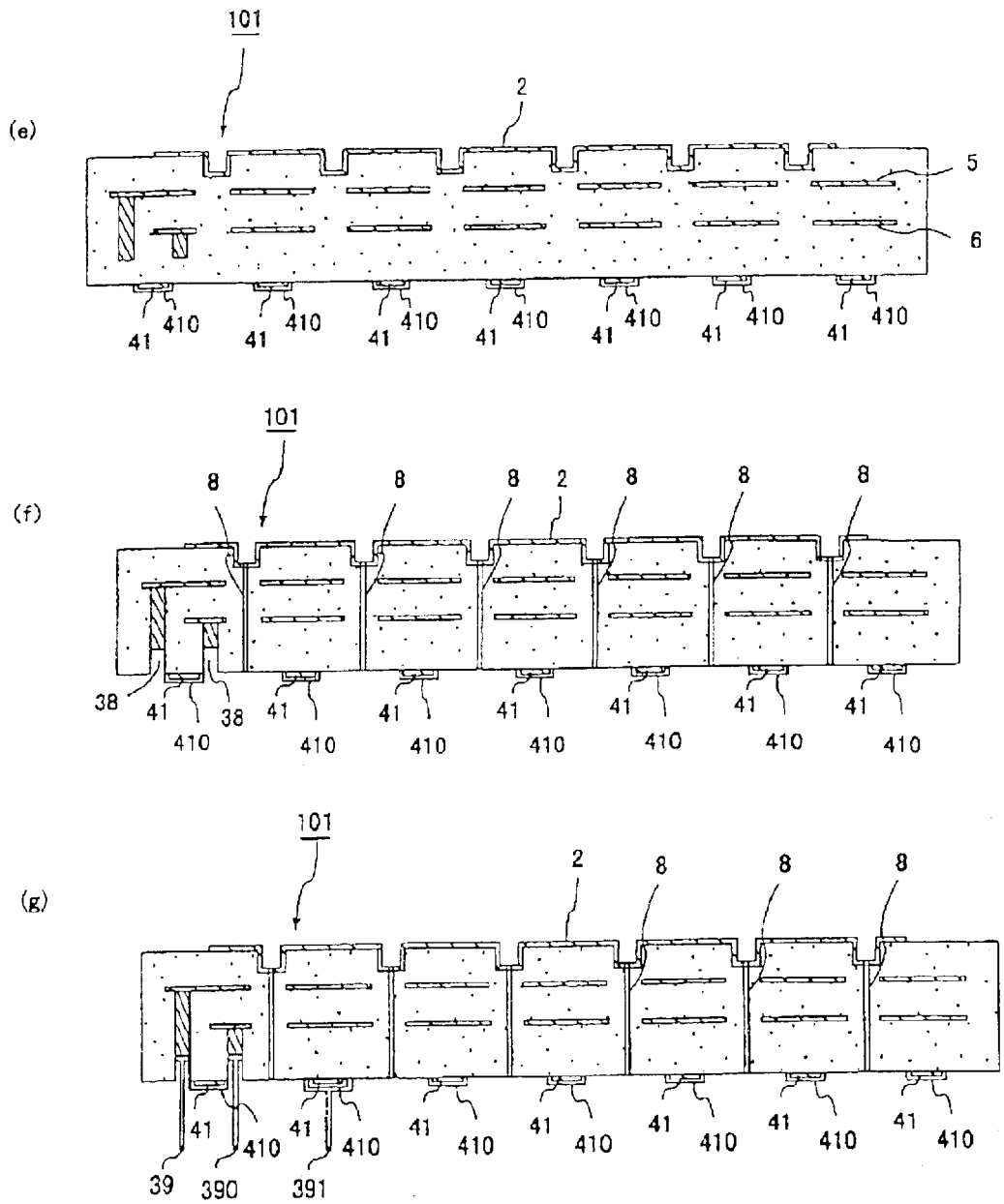
FIG. 5(*e*) to (*g*) are schematic views showing a further part of the flow of production of the water prober according to the invention.

The above ceramic substrate was further dipped in an electroless gold plating bath containing gold potassium cyanide: 2 g/l, ammonium chloride: 75 g/l, sodium citrate: 50 g/l, and sodium hypophosphite: 10 g/l at 93° C. for 1 minute to construct a 1 m-thick gold plating layer on the nickel plate for use as said chuck top conductor layer 2 (FIG. 5(*e*)).

(10) The substrate was drilled to form air suction holes 8 extending from the grooves 7 to the reverse side. In addition, blind holes 38 were formed for exposing the conductor-filled through holes (FIG. 5(*f*)). In the blind holes 38, external terminal pins 39, 390 composed of Koval® were secured in position with a gold brazing material composed of Ni—Au alloy (Au: 81.5%, Ni: 18.4%, impurity: 0.1%) heated for reflow at 970° C. (FIG. 5(*g*)).

In addition, external terminal pins 391 made of Koval were securely attached to the resistance heating element 41 (nickel layer 410) through a solder (tin:lead=9/1) layer.

(11) A plurality of thermocouples for temperature control were embedded in said cavities to complete a wafer prober.

Comparative Example 1
Manufacture of a Ceramic Heater Having a Resistance Heating Element on the Surface (1) Except that the aluminum nitride powder H with a mean particle diameter of 1.1 μm was used, the procedure of Example 1 was otherwise repeated to manufacture a ceramic heater.

Comparative Example 2
Manufacture of a Ceramic Heater Internally Provided with a Resistance Heating Element and Static Electrodes for Use as an Electrostatic Chuck (1) Except that the aluminum nitride powder H with a mean particle diameter of 1.1 μm was used, the procedure of Example 2 was otherwise repeated to manufacture a ceramic heater internally provided with static electrodes for use as an electrostatic chuck.

Comparative Example 3
Wafer Prober (1) Except that the aluminum nitride powder H with a mean particle diameter of 1.1 μm was used, the procedure of Example 3 was otherwise repeated to manufacture a wafer prober.

With the ceramic heaters, electrostatic chucks and wafer probers manufactured as described in Examples 1 to 3 and Comparative Examples 1 to 3, the radiation level of α-rays was determined. Moreover, a semiconductor wafer was set on each ceramic heater or wafer prober and the erratic action of the heater, electrostatic chucking force, and the number of particles deposited were investigated. The results are presented in Table 2.

The α-rays level was measured under the following conditions.
Measuring instrument: Low-level α-counter ACS-4000M
Voltage applied: 1.9 kV
Counting gas: PR-10 gas (Ar: 90%, methane: 10%)
Sample area: 387 $cm^2$
Total counting time: 99 hr.
Counting efficiency: 80%
Range of error: ±0.003 $c/cm^2 \cdot hr$ The heater erratic action was evaluated by plotting the temperature data from the thermocouples to construct a temperature rise profile and checking for data markedly deviating from the profile.

The electrostatic chucking force was measured with a load cell. The erratic action of the wafer prober was evaluated by performing a conduction test with it on 100 silicon wafers judged to be acceptable in the test using a commercial wafer prober having a metallic chuck top plate and checking if even one of the wafers was found to be rejected.

The number of particles deposited on the wafer was determined as follows. Thus, a silicon wafer was set on the ceramic substrate and the heater was operated at a temperature setting of 300° C. Then, the number of particles not less than 0.2 μm in diameter as deposited on the mirror-finished surface of the wafer (Ra=0.3 μm) was counted with an electron microscope.

More particularly, using 5 silicon wafers which had undergone the above heating test, 10 randomly selected areas per wafer were photographed with an electron microscope. The number of particles not smaller than 0.2 μm in diameter was counted, and based on the number of particles thus counted and the total area of fields of vision of the photographs, the number of particles per $cm^2$ was calculated.

TABLE 2

| | Powder | Level of α-rays ($c/cm^2 \cdot hr$) | Occurrence of erratic action | Chucking force ($g/cm^2$) | Error in testing | Number of particles (piece/$cm^2$) |
|---|---|---|---|---|---|---|
| Ex. 1 | A | 0.001 | No | — | — | 7 |
| | B | 0.005 | No | — | — | 9 |
| | C | 0.021 | No | — | — | 8 |
| | D | 0.027 | No | — | — | 7 |
| | E | 0.048 | No | — | — | 8 |
| | F | 0.210 | No | — | — | 20 |
| | G | 0.240 | No | — | — | 30 |
| Ex. 2 | A | 0.001 | No | 125 | — | — |
| | B | 0.005 | No | 120 | — | — |
| | C | 0.021 | No | 119 | — | — |
| | D | 0.027 | No | 118 | — | — |
| | E | 0.048 | No | 118 | — | — |
| | F | 0.210 | No | 123 | — | — |
| | G | 0.240 | No | 121 | — | — |
| Ex. 3 | A | 0.001 | No | — | No | — |
| | B | 0.005 | No | — | No | — |
| | C | 0.021 | No | — | No | — |
| | D | 0.027 | No | — | No | — |
| | E | 0.048 | No | — | No | — |
| | F | 0.210 | No | — | No | — |
| | G | 0.240 | No | — | No | — |
| Comp. Ex. 1 | H | 0.260 | Yes | — | — | 120 |
| Comp. Ex. 2 | H | 0.260 | Yes | 100 | — | — |
| Comp. Ex. 3 | H | 0.260 | Yes | — | Yes | — |

The results are shown in Table 2. Thus, in the case of the ceramic heaters according to Example 1, no erratic action was noted within the α-ray emission (cm².hr ) range of 0.001 to 0.240 c/cm².hr. However, erratic actions appeared when the α-radiation level exceeded 0.250 c/cm².hr.

In the case of the electrostatic chucks according to Example 2, a chucking force of about 120 g/cm² was obtained when level of α-rays was 0.001 to 0.240 c/cm².hr.

In the case of the wafer probers according to Example 3, no testing error was noted within the α-rays emission range of 0.001 to 0.240 c/cm².hr.

The reason for existence of the above-mentioned threshold is not definitely clear but it is suspected that over the threshold level, electron-hole pairs are created in the silicon wafer by α-rays and as the threshold is exceeded, excessive charging occurs to produce static electricity.

On the other hand, when the emission level of α-rays (cm².hr) was between 0.001 and 0.048 c/cm².hr, the number of particles was generally 7 to 9/cm² but within the range of 0.048 c/cm².hr to 0.240 c/cm².hr, the number of particles was 20 to 30/cm². Moreover, at the α-rays level of 0.260 c/cm².hr, the number of particles was not less than 120/cm².

The number of particles was not counted for the electrostatic chuck and wafer prober. This is because, in the case of electrostatic chucks, the deposition of particles attributable to the static electricity generated by the electrodes cannot be differentiated from the deposition caused by α-rays and, in the case of wafer probers, the silicon wafer is not brought into contact with the ceramics so that substantially no deposition of particles takes place.

INDUSTRIAL APPLICABILITY

As described above, the ceramic heater, electrostatic chuck and wafer prober of the present invention are advantageous in that the emission level of α-rays is kept low enough to prevent the occurrence of erratic actions and decrease in chucking force in the case of the heater or the wafer prober and thus decreasing the number of particles deposited on the semiconductor wafer to thereby eliminate the risk for wafer circuit defects.

What is claimed is:

1. A ceramic heater for heating a semiconductor wafer, comprising:
    a sintered ceramic substrate and a heating element disposed on a surface of said sintered ceramic substrate or inside of said sintered ceramic substrate,
    wherein the level of α-rays radiated from the surface of said ceramic substrate is not higher than 0.250 c/cm².hr.

2. The ceramic heater for heating a semiconductor wafer according to claim 1, wherein said ceramic substrate is in the form of a disk.

3. The ceramic heater for heating a semiconductor wafer according to claim 1, wherein said ceramic substrate comprises a nitride ceramic, a carbide ceramic or an oxide ceramic.

4. The ceramic heater for heating a semiconductor wafer according to claim 1, wherein said ceramic substrate contains a sintering aid.

5. The ceramic heater for heating a semiconductor wafer according to claim 1, said ceramic substrate comprises a bottomed hole and a temperature probe embedded in the bottomed hole.

6. The ceramic heater for heating a semiconductor wafer according to claim 1, which is used at a temperature ranging from 150° C. to 900° C.

7. The ceramic heater for heating a semiconductor wafer according to claim 1, which heats a semiconductor wafer held with a clearance from a surface of said ceramic substrate.

8. The ceramic heater for heating a semiconductor wafer according to claim 1, wherein the level of α-rays radiated from a surface of said ceramic substrate is not higher than 0.210 c/cm².hr.

9. The ceramic heater for heating a semiconductor wafer according to claim 1, wherein said ceramic substrate is in the form of a disk and has a diameter of not less than 200 mm.

10. The ceramic heater for heating a semiconductor wafer according to claim 1, wherein said ceramic substrate has a thickness of 0.5 to 50 mm.

* * * * *